US005182538A

United States Patent [19]

Müller

[11] Patent Number: 5,182,538

[45] Date of Patent: Jan. 26, 1993

[54] BIMETAL THERMOSWITCH

[75] Inventor: Manfred K. Müller, Pforzheim, Fed. Rep. of Germany

[73] Assignee: Limitor AG, Zurich, Switzerland

[21] Appl. No.: 686,843

[22] Filed: Apr. 17, 1991

Related U.S. Application Data

[60] Continuation of Ser. No. 582,136, Sep. 12, 1990, abandoned, which is a continuation of Ser. No. 305,948, Feb. 2, 1989, abandoned, which is a division of Ser. No. 86,087, Aug. 27, 1987, Pat. No. 4,847,587.

[30] Foreign Application Priority Data

Nov. 7, 1985 [DE] Fed. Rep. of Germany ....... 3539425

[51] Int. Cl.[5] ........................ H05K 1/16; H01H 37/52

[52] U.S. Cl. .................................. 337/102; 200/83 P; 361/400; 337/103; 337/107; 338/215; 338/272

[58] Field of Search ...................... 200/83 P, 405, 449; 361/400, 402, 397, 403; 338/200, 215, 272, 332; 337/104, 109, 111, 343, 354, 365, 297, 377, 380, 102, 107, 103

[56] References Cited

U.S. PATENT DOCUMENTS

| | | | |
|---|---|---|---|
| 3,972,016 | 7/1976 | Schmitt | 337/354 |
| 3,978,443 | 8/1976 | Dennis et al. | 337/297 |
| 4,365,225 | 12/1982 | Olsen | 335/354 |
| 4,591,820 | 5/1986 | Ruszczyk et al. | 337/354 |
| 4,591,822 | 5/1986 | Versaw et al. | 337/354 |
| 4,626,818 | 12/1986 | Hilgers | 337/297 |
| 4,847,587 | 7/1989 | Muller | 200/83 P |
| 4,862,132 | 8/1989 | Hollweck | 337/102 |

*Primary Examiner*—Gerald P. Tolin

*Attorney, Agent, or Firm*—Dvorak and Traub

[57] ABSTRACT

The bimetal thermoswitch consists of an electrically insulating, flat carrier (1), at least two electric terminals (3, 4), which are secured to the carrier (1) and are respectively connected to a fixed contact (10), which is mounted on the carrier, and to a contact spring (8), which is secured at one end to the carrier (1) and at its other end carries a movable contact element (9), which cooperates with the fixed contact (10). The carrier (1) consists of an alumina ceramic slab.

49 Claims, 8 Drawing Sheets

FIG. 4
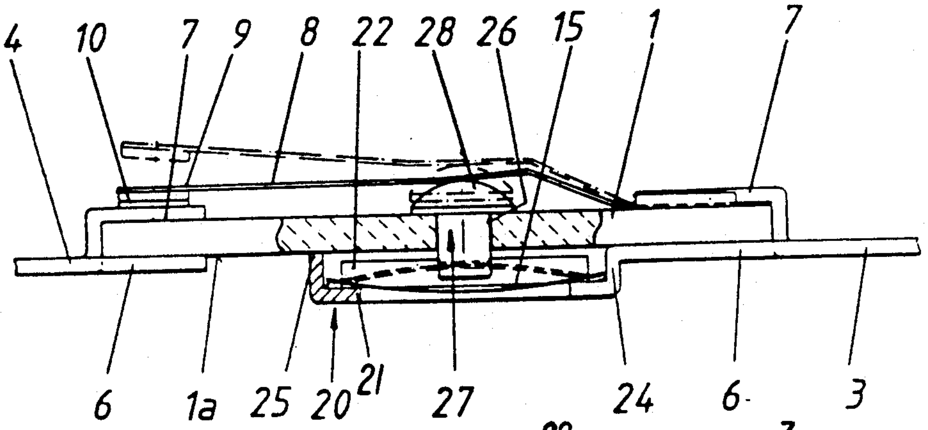
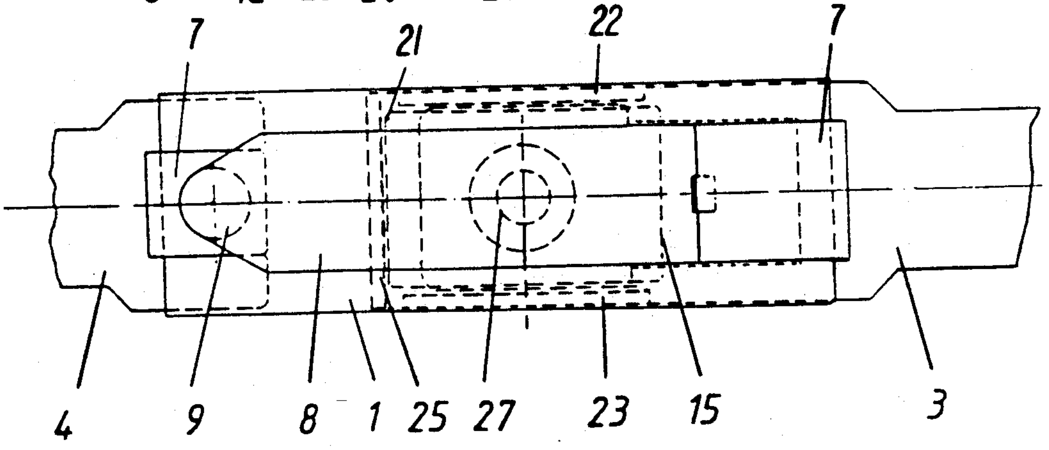
FIG. 5

FIG. 6
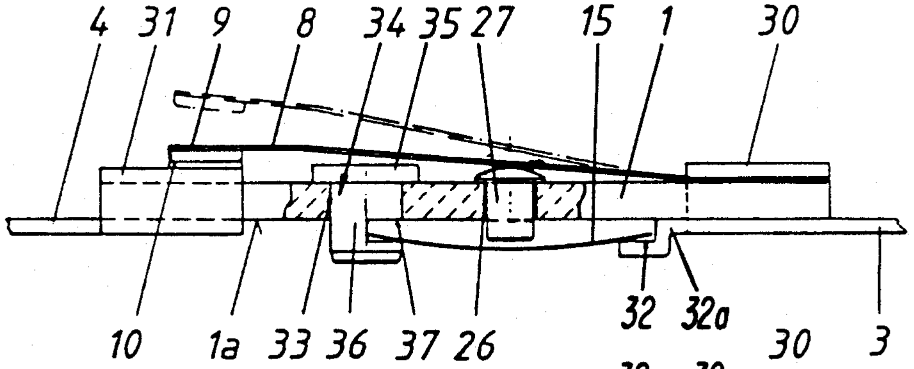
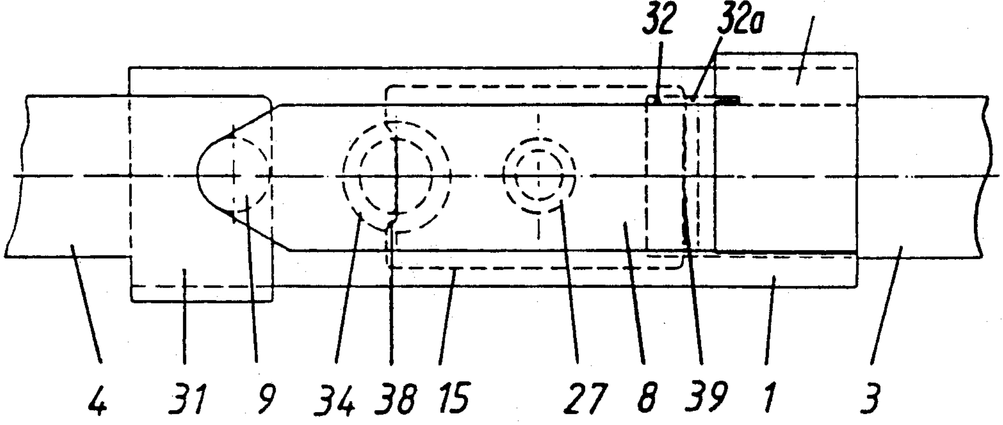
FIG. 7

FIG. 8
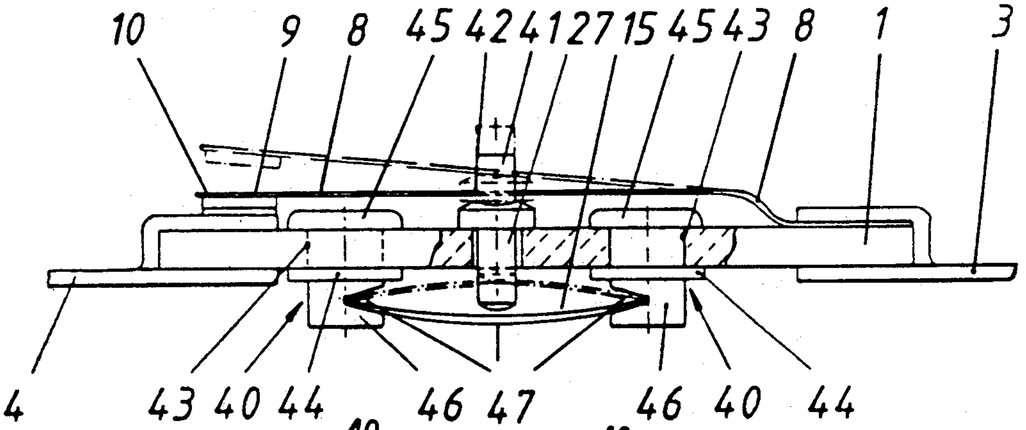
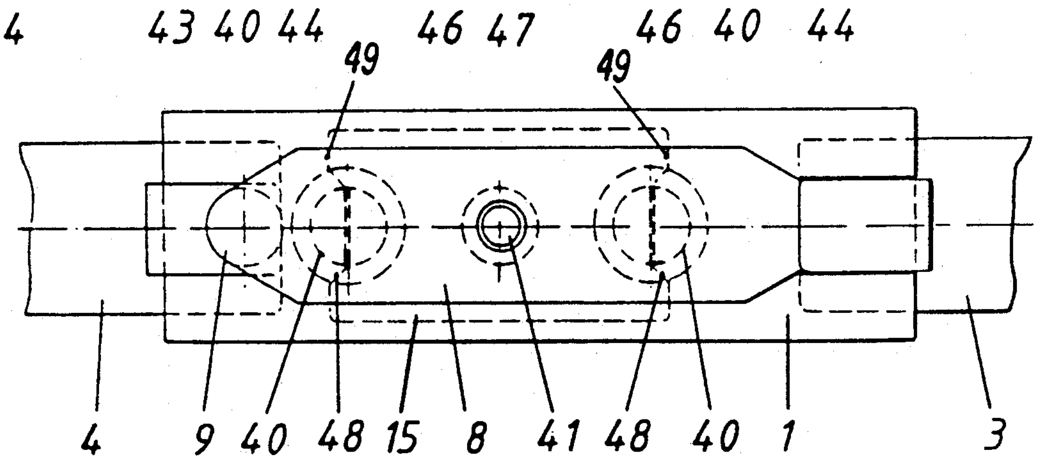
FIG. 9

FIG. 10
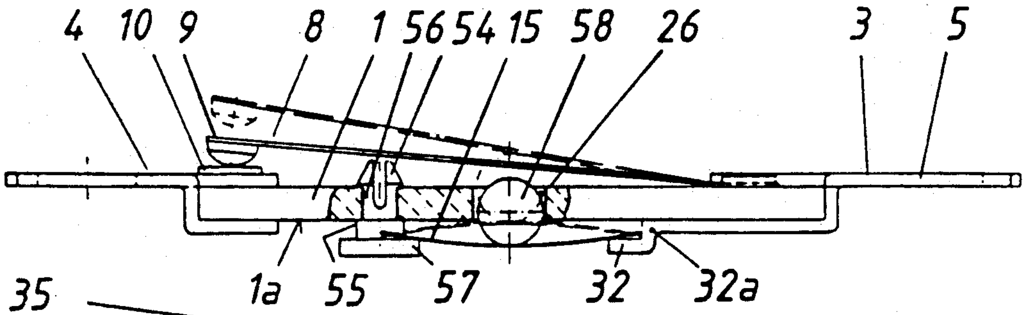
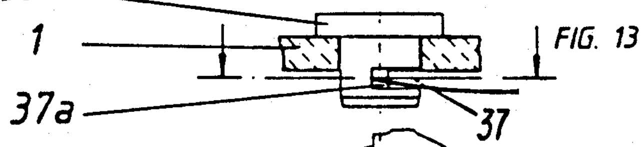
FIG. 12
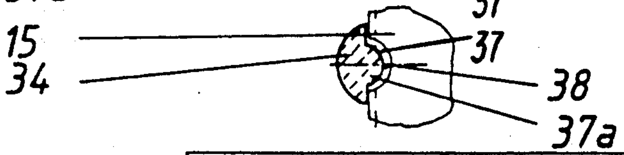
FIG. 13
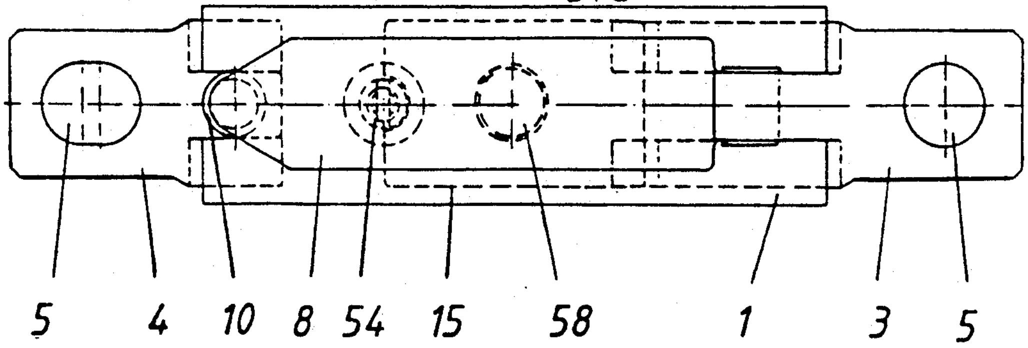
FIG. 11

FIG. 14
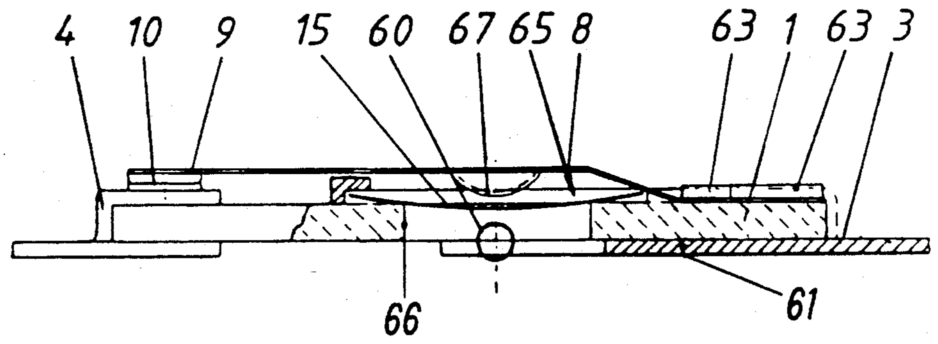
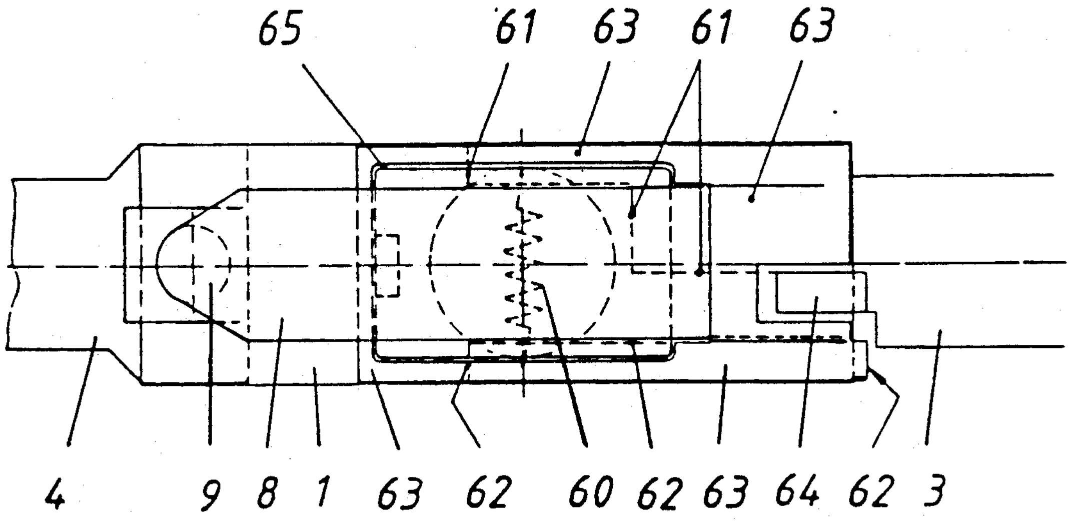
FIG. 15

FIG. 16
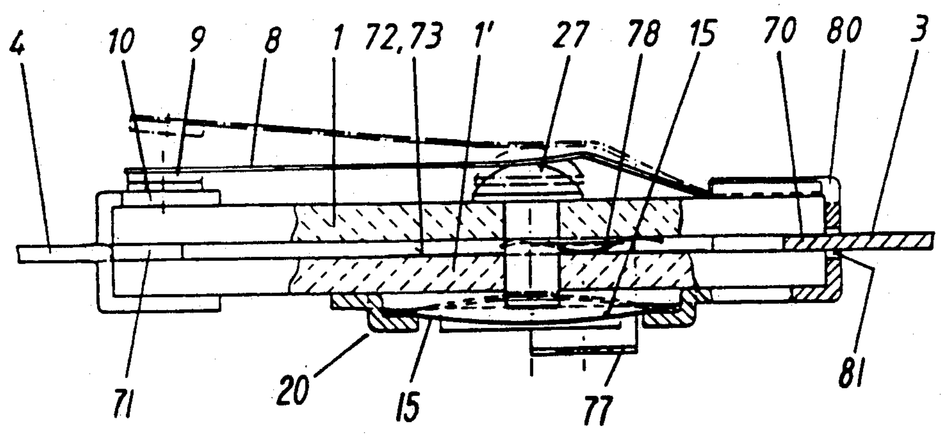
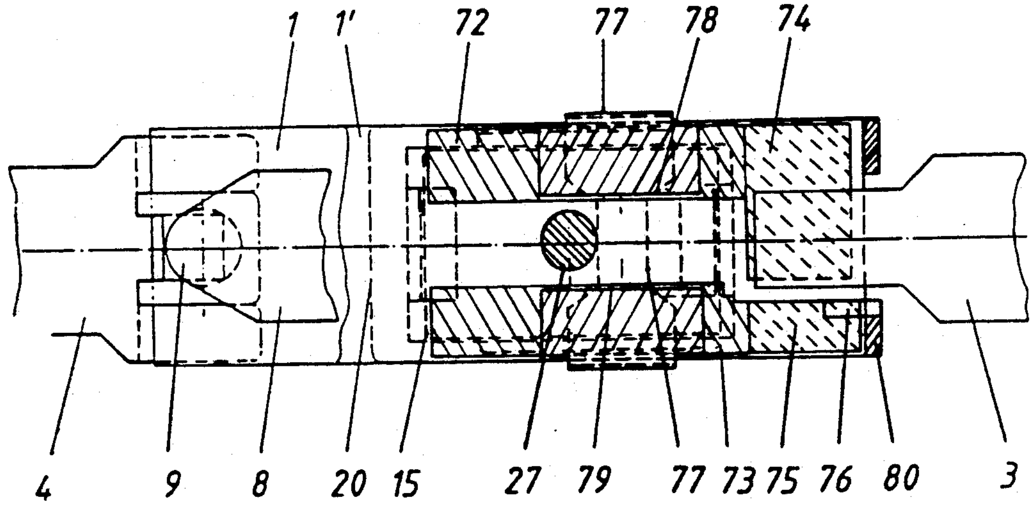
FIG. 17

FIG. 18
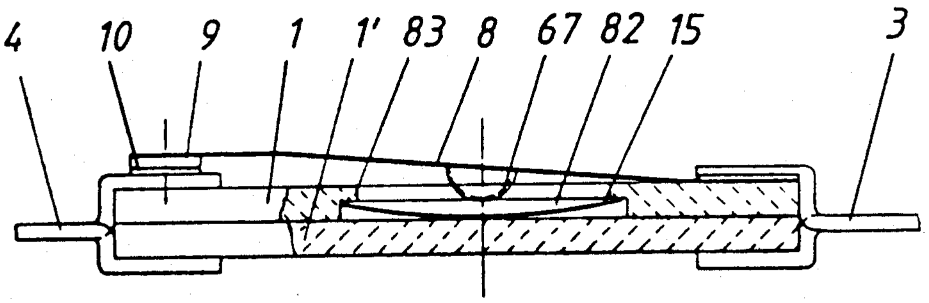
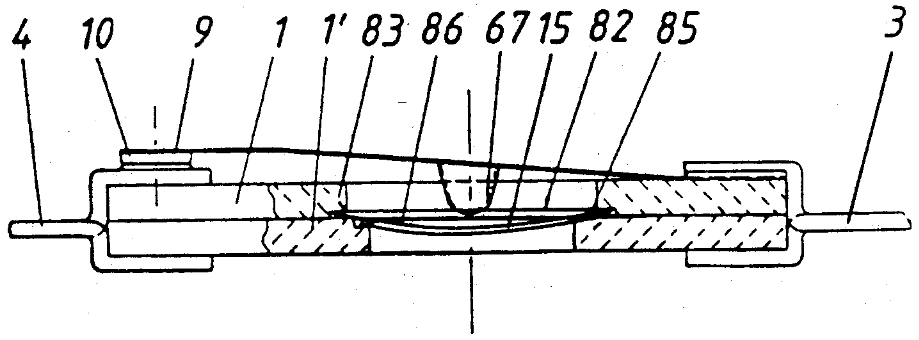
FIG. 19

BIMETAL THERMOSWITCH

This application is a continuation of application Ser. No. 582,136, filed Sep. 12, 1990, now abandoned, which is a continuation of Ser. No. 305,948, filed Feb. 2, 1989, which is a division of Ser. No. 086,087, filed Aug. 27, 1987, both now abandoned, which is based on PCT/EP86/00062, filed Nov. 7, 1986.

TECHNICAL FIELD

This invention relates to a bimetal thermoswitch having the features recited in the prior art part of claim 1.

PRIOR ART

Such switch has been described in DE-29 16 516 A1 and consists of a thermoswitch which is mounted on a printed circuit board as a carrier. One or more heating resistors may be provided on the printed circuit board and may permit the thermoswitch to operate as a relay or as a time limit relay.

The known switch has the disadvantage that the printed circuit board tends to be distorted under thermal stress so that a satisfactory function of the thermoswitch is not ensured and at least its switching temperature may be changed.

DISCLOSURE OF THE INVENTION

It is an object of the invention to provide a bimetal thermoswitch which is of the kind described first hereinbefore and can be made as a very flat structure and will remain dimensionally stable even under different temperature stresses and can be used for and adapted to numerous applications.

That object is accomplished by a bimetal thermoswitch having the features recited in claim 1. Desirable further improvements of the invention are covered by the dependent claims.

The novel bimetal thermoswitch uses as a carrier a thin slab of alumina ceramics, which is also described as a wafer in semiconductor technology. The manufacture of such alumina ceramic slabs having an extremely high ultimate strength is known in the art. But in spite of their advantages, which will be described hereinafter, such slabs have not been used thus far as carriers for protective bimetal switches.

Owing to their strength, the alumina ceramic slabs used as carriers for the bimetal thermoswitches may be much thinner than the carriers of injection-molded plastic which have often been used thus far for small, open thermoswitches, and may also be thinner than printed circuit boards. As a result, the carrier used in accordance with the invention has only a relatively small heat capacity, which has a desirable influence on the response time of the switch. Such a carrier of alumina ceramics has a high thermal stability also and particularly when used in the form of a thin slab. It may be used up to much higher temperatures than plastic carriers or printed circuit boards and nevertheless will not be distorted. Another advantage resides in that it has a lower coefficient of expansion than plastics. Besides, a slab of alumina ceramics can inherently be made to have a higher dimensional stability than an injection molding of plastic so that the tolerance problems are alleviated in the manufacture of a bimetal switch having an alumina ceramic slab as a carrier.

Moreover, an alumina ceramic slab can be provided with conductor strips and with electric components, just as a printed circuit board, and resistors and other active or passive circuit components and even complete circuits can be integrated in the carrier slab so that the switch constitutes a compact and economical hybrid component.

An embodiment of the switch in accordance with the invention which is particularly simple but important for practical use is characterized in that the alumina ceramic carrier carries on one side those elements of the bimetal thermoswitch which are known in the art and is provided on the opposite side (on the underside) with a resistor layer so that the switch constitutes a thick-film resistor. If the resistor layer is arranged to shunt the switch, the latter can be used as an overtemperature switch which after a temperature rise above a predetermined value will not close automatically but will remain open because when the switch has opened the current will flow only through the resistor layer so that the latter is heated and generates and transmits to the bimetal element such a quantity of heat that said element is maintained above its switching temperature. When such a switch is designed in accordance with the invention, it will be much more compact and economical than the switch which has been described in German Patent Specification 32 31 136, which also remains open after a temperature rise above its switching temperature.

In another embodiment of the switch, two film resistors may be provided on the underside of the carrier slab, one of said resistors may shunt the switch and another may be arranged as a series resistor in that it is connected to one of the two electric terminals associated with the two switch contacts and, at its other end, to a third electric terminal. In the design in accordance with the invention such a switch distinguishes by a more compact and more economical design from a comparable switch, such as has been described in German Utility Model 84 11 838.

It will be understood that more than two film resistors may be provided on the carrier slab for other applications.

In another embodiment a fusible wire connected in series with the switch contacts might be provided on the alumina ceramic slab. In a protective overtemperature switch such a fusible wire will afford an additional protection in case the switch contacts do not separate, e.g., because they stick, when the switching temperature has been exceeded. In that case the fusible wire will be heated above its melting temperature so that the circuit is interrupted.

An alumina ceramic slab is excellently suitable for being provided with sensors for generating an electric output signal. The output signal of such sensor may be used to activate a heating resistor, which is provided on the carrier slab and heats the bimetal element so that the switch is actuated.

The required electric terminals of the bimetal thermoswitch could be secured on the carrier in that holes are drilled into the carrier, e.g., by means of a laser beam, and the terminals are screwed or riveted to the carrier at the resulting drilled holes. But it will be more desirable to metallize the carrier in part, preferably on its bottom surface, and to provide forked terminals which with their forked portion can be fitted onto the carrier in separate metallized areas, whereafter the terminals are soldered to the carrier. Soldering may be performed by economical automatic processes which are conventional in electronic production, e.g., in that the carrier slabs are moved through a wave soldering bath.

The fact that an alumina ceramic slab can be metallized results in the further advantage afforded by the invention that the fixed contact can also be formed by a selective metallization of the top surface of the carrier, particularly by a printing process.

Alternatively, the electric terminals may be used also as a carrier for the fixed contact of the switch and/or as a carrier for that end of the contact spring which is to be fixed to the carrier. The joint between the fixed contact and the one terminal and the joint between the contact spring and the other terminal may be made in conventional manner by spot welding. Owing to the temperature stability of alumina ceramics the welding operation may be performed even after the electric terminals have been secured to the carrier slab. The reflow process is a particularly desirable other process of securing the terminals to the carrier. In that process a solder is forced onto the carrier at the intended fixing points, the terminals, which for that purpose are preferably forked, are clamped to said solder, and the terminals are subsequently soldered in a soldering furnace.

A further advantage afforded by the invention resides in that relatively large alumina ceramic slabs can be used in the manufacture of bimetal thermoswitches, a substantial number of juxtaposed bimetal thermoswitches can be formed on said slabs, and the slabs can be severed along predetermined lines between the bimetal thermoswitches only in a last manufacturing step.

In dependence on the intended purpose of the switch the contact spring itself may be made of a thermostatic bimetal (for use as an overcurrent switch) or a separate bimetal element for actuating the contact spring may be provided. In the last-mentioned case a bimetal snap-action plate is preferably used and is provided between the contact spring and the carrier. A snap-action plate is a plate which has been embossed to have a camber and owing to its camber can assume two stable shapes having mutually opposite cambers. In such plate the change between the two shapes is suddenly affected. A snap-action bimetal plate could be held and centered by means of hooks and lugs which are provided on top or at the bottom of the contact spring and which retain and at least partly embrace the snap-action bimetal plate at its edge. But it will be more desirable to provide a plastic pin, which extends with a play through a hole in the snap-action bimetal plate and is either secured to the contact spring and protrudes with a play through a hole in the carrier or is secured to the carrier and protrudes with a play through a hole in the contact spring. That pin is suitably provided between the contact spring and the snap-action bimetal plate with a collar for spacing said two parts apart. Alternatively, the contact spring may be provided, e.g., by a deep-drawing operation, with an extension, which extends with a play through a hole in the snap-action bimetal plate and through a hole in the carrier.

It will be important to keep the snap-action bimetal plate and the contact spring spaced apart if a transfer of Joule heat from the contact spring to the snap-action bimetal plate is to be prevented. For that purpose it is recommendable to provide between the contact spring and the snap-action bimetal plate an insulating plastic member, which is inserted either into a hole of the bimetal plate or into a hole in the contact spring and may be joined to both, if desired. To minimize the heat transfer between the contact spring and the snap-action bimetal plate that plastic member—and similarly the collar of the pin described hereinbefore—is designed to have a surface which is as large as possible so that it can be used to heat-insulate the snap-action bimetal plate from the contact spring.

The best way to inhibit a heat transfer from the contact spring to the separate bimetal plate is to arrange the bimetal plate on that side of the carrier which faces away from the contact spring.

The contact spring and the bimetal element may be provided on the same side of the carrier. But for numerous uses it will be more desirable to provide the contact spring on one side and the bimetal element on the other side of the carrier because in that case the bimetal element will be protected from a thermal influence of the current-carrying contact spring by the interposed carrier. In that case the required operative connection between the bimetal element and the contact spring is suitably provided by an actuating element, which is disposed in a hole of the carrier between the bimetal element and the contact spring.

The actuating element might consist of a push rod, which is axially guided in the longitudinal direction of the push rod in a bore which constitutes an opening in the carrier. To prevent a loss of that push rod, it might be secured to the bimetal element. But it will be more desirable to secure the push rod to the contact spring in order to minimize the influence on the switching characteristics of the bimetal element. In another, particularly desirable embodiment the push rod is secured neither to the contact spring nor to the bimetal element but is loosely arranged between them in a bore of the carrier. Owing to the loose arrangement the heat transfer from the contact spring via the push rod to the bimetal element is minimized. In order to prevent a loss of the push rod even though it is loosely arranged, the push rod is preferably formed at one end with a head which is larger in diameter than the hole in the carrier. That head will also improve the thermal shielding between the contact spring and the bimetal element. To ensure that the push rod cannot slip out of the carrier in the direction in which the head of the push rod faces, the diameter of the bore in the carrier should not substantially exceed the diameter of the push rod below its head. This will ensure that the push rod cannot obliquely slip out of the bore of the carrier past the contact spring but will always be trapped between the contact spring at one end and the bimetal element at the other end. An improved guidance of the push rod and an improved centering of the push rod on the contact spring can be achieved in that the push rod is provided above its head with an extension, which extends through a hole that is formed in the contact spring at a suitable location.

In a particularly desirable embodiment of the bimetal thermoswitch in accordance with the invention the actuating element which is trapped between the bimetallic element on one side and the contact spring on the other side and is disposed in a hole in the carrier consists of a ball, which preferably consists of glass or of a ceramic material. Such a ball will afford the advantage that it is a particularly poor heat link between the contact spring and the bimetal element and that it can be mounted in a particularly convenient manner. The balls can be sieved to ensure in a simple and economical manner that the balls which are used differ only so slightly in diameter that said spread in diameter will not result in an appreciable spread of the switching temperature. The spread of the switching temperature will also be minimized by the use of an alumina ceramic carrier because the latter can be made to have a very high dimensional stability and will not be distorted but will maintain its shape even after prolonged use and after a large number of temperature cycles. The combination of a carrier consisting of a thin alumina ceramic slab and a loose ball as an actuating element between the bimetal element and the contact spring will be particularly desirable because it will minimize the spread of the switching temperatures of bimetal thermoswitches of a given series. This advantage should not be underestimated because such switches are made in large quantities. The use of such balls is permitted and is rendered interesting particularly by the provision of the very thin alumina ceramic carrier because the advantages will be the larger the smaller the balls are. But the diameter of the balls must exceed the thickness of the alumina ceramic carrier, which preferably has a thickness between 1.0 and 1.5 mm. The diameter selected for the balls is preferably twice the thickness of the carrier. Such small balls—particularly if they consist of ceramic or glass—are so light in weight and have such a low heat capacity that they will not influence the switching temperature of the bimetal element.

In principle, the bimetal element might consist of a bimetal spring which is soldered on one end to the bottom surface of the carrier. But it will be more desirable to use a snap-action bimetal plate instead, which is loosely—but captively—held on the carrier by holders, which are secured to the carrier and embrace the rim of the bimetal element and/or constitute a stop for the edge of the bimetal element. Suitable holders for the snap-action bimetal plate consist, e.g., of lugs, which have been fixed by soldering to the top surface of the carrier and are reversely bent to the underside of the carrier and act there like mounting corners for photographs to retain the bimetal plate. At least one of the holders suitably constitutes an integral part of one of the two electric terminals of the switch and for that reason need not separately be mounted. In combination with such holder, which is an integral part of one of the two electric terminals, it is preferable to use an additional holder comprising a pin, which has been captively inserted, particularly resiliently locked, in a bore of the carrier. That second holder may consist of a plastic injection molding. It will obviously also be possible to retain the bimetal plate only by such holders which have been inserted into and are particularly resiliently locked in the carrier. The holders must hold the bimetal plate against a slipping out in any direction. This can be accomplished with only two holders if the bimetal element is provided at one edge with two mutually opposite recesses, which receive a nose of respective holders. Conversely the bimetal element might be provided at mutually opposite edges with noses, which extend into recesses in the two mutually opposite holders. But the arrangement described before is more desirable.

A further advantage afforded by the use of a carrier consisting of a thin alumina ceramic slab resides in that both electric terminals of the switch can readily be provided at one and the same end of the carrier. In that case a conductor strip that has been printed on the carrier leads from the fixed contact to that end of the carrier where the terminal for the contact spring is also disposed.

Another advantage of the use of a thin alumina ceramic slab as a carrier resides in that the bimetal thermoswitch can easily be provided with an adjustable resistor. For this purpose a resistor layer may be applied to the bottom surface of the carrier and may be connected at one end to one of the electric terminals of the switch. A slider, e.g., a U-shaped spring which is guided on the carrier, may be in sliding contact with said resistor layer and with a conductor strip which is provided on the top surface of the carrier and leads to another electric terminal of the switch.

In a particularly desirable embodiment of the bimetal thermoswitch in accordance with the invention, another alumina ceramic slab is provided under the carrier and is joined to the carrier to form a sandwich unit. In that case a switch having a given base area may be combined with a relatively large number of electric components, particularly film resistors, or an effectively protected resistor layer may be provided in the space between the two alumina ceramic slabs. If the alumina ceramic slabs do not lie one on the other but are slightly spaced apart, it will be preferable to provide one of the two confronting surfaces of the two slabs with a resistor layer, which is connected at one end to one of the terminals, which are secured to the slabs, and at the other end to an electric contact member, which constitutes a slider, so that a potentiometer is provided. In that arrangement the slider and the resistor layer are effectively protected and the slider is exactly guided and for an application of an always adequate contact pressure to the resistor layer may be backed by the opposite alumina ceramic slab.

An arrangement consisting of two alumina ceramic slabs which lie directly on each other will be particularly desirable for use in connection with a further improved embodiment of the switch in accordance with the invention in which the unit consisting of the two slabs is formed under the contact spring with an opening, which is open toward the contact spring and in which the bimetal element consisting of a snap-action plate is loosely held at the boundaries of the recess. In that design there is no need for separate holders, such as hooks or lugs or the like, on the carrier. The opening may be formed, e.g., in that a through hole is provided in the upper alumina ceramic slab and has a lower portion which slightly exceeds the diameter of the snap-action bimetal plate whereas the hole is so constricted at its top rim by a collar or by inwardly protruding projections that the snap-action bimetal plate cannot fall out of the hole at its top. When the bimetal plate has been inserted into the hole in the upper slab from below, the hole is covered by the lower alumina ceramic slab so that the snap-action bimetal plate cannot fall out also at the bottom. The corresponding portion of the lower alumina ceramic slab need not be formed with an opening or the lower slab may be provided with an open-topped blind hole, which has the same diameter as the adjoining hole in the upper slab. In that case the snap-action bimetal plate will be disposed in an opening which extends into both slabs. The hole in the lower slab may desirably be larger in diameter than the adjoining hole in the upper slab and the hole in the upper slab may be unconstricted at its top rim. In that case the bimetal plate may be movably mounted in the blind hole in the upper slab and the narrower hole in the upper slab will prevent a loss of the bimetal plate. It will be understood that a through hole rather than a blind hole may be provided in the lower slab and may be constricted at its bottom end by a collar or by inwardly protruding projections.

In a bimetal thermoswitch in which the snap-action bimetal plate is disposed in an opening in the alumina ceramic slabs, as described, the contact spring is suitably provided with a bulge or pin, which extends toward the snap-action bimetal plate so as to decrease the distance between the bimetal element and the contact spring, which distance has been increased because the bimetal element is sunk.

A bimetal thermoswitch in which the snap-action bimetal plate is disposed in an opening in the alumina ceramic slab can be improved in a particularly desirable manner in that the opening contains between the bimetal element and the contact spring an ordinary snap-action plate, which has a uniform coefficient of expansion, i.e., a snap-action plate which does not tend to invert its camber under the action of temperature. Such an ordinary snap-action plate is inserted into the opening in such a manner that the camber of the plate faces in the same direction as the camber of the snap-action bimetal plate when it is below its switching temperature. A temperature rise of the snap-action bimetal plate above its switching temperature will then result in a sudden inversion of the camber of that plate so that an inversion of the camber of the ordinary snap-action plate will be enforced and the latter plate will act on the contact spring to lift the same. That arrangement affords the advantage that a temperature drop below the switching temperature of the bimetal element will cause the latter to spring back to its original shape whereas the ordinary snap-action plate will not be reversed but will continue to hold the switch in an open position until the latter plate is restored by hand. Such a keeping in an open position after a fault is specified for numerous uses for reasons of safety.

BRIEF DESCRIPTION OF THE DRAWINGS

FIG. 4 is a side elevation showing partly in section a second bimetal thermoswitch.

FIG. 5 is a top plan view showing the switch of FIG. 4.

FIG. 6 is a side elevation showing partly in section a third bimetal thermoswitch.

FIG. 7 is a top plan view showing the switch of FIG. 6.

FIG. 8 is a side elevation showing partly in section a fourth bimetal thermoswitch.

FIG. 9 is a top plan view showing the switch of FIG. 8.

FIG. 10 is a side elevation showing partly in section a fifth bimetal thermoswitch.

FIG. 11 is a top plan view showing the switch of FIG. 10.

FIG. 12 is a longitudinal sectional view showing as a detail the carrier of the bimetal thermoswitch another embodiment of a holder for a snap-action bimetal plate.

FIG. 13 shows the holder of FIG. 12 in a sectional view on a plane that is parallel to the carrier of the switch.

FIG. 14 is a side elevation showing partly in section a sixth bimetal thermoswitch.

FIG. 15 is a top plan view showing the switch of FIG. 14.

FIG. 16 is a side elevation showing partly in section a seventh bimetal thermoswitch.

FIG. 17 is a top plan view showing the switch of FIG. 16.

FIG. 18 is a side elevation showing partly in section an eigth bimetal thermoswitch.

FIG. 19 is a side elevation showing partly in section a ninth bimetal thermoswitch.

DETAILED DESCRIPTION OF THE DRAWING WITH WAYS OF EMBODYING THE INVENTION

Figure 1:
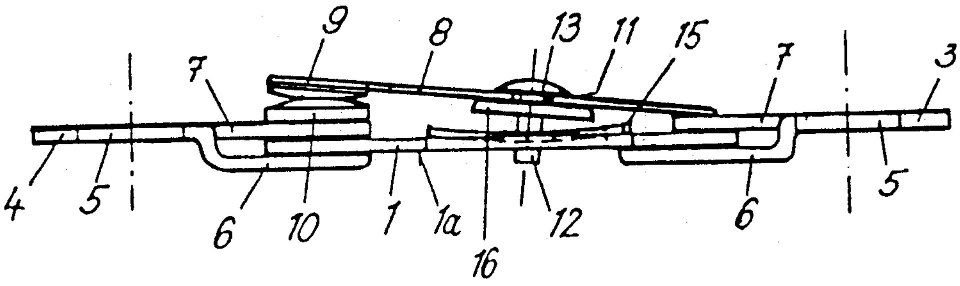
FIG. 1 is a side elevation showing a bimetal thermoswitch.

In the various illustrative embodiments, like or corresponding parts of the bimetal thermoswitches are designated with the same reference numerals.

Figure 2:
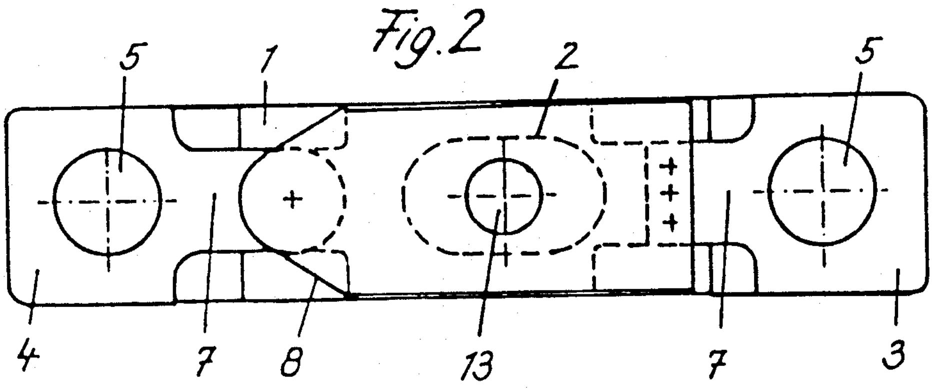
FIG. 2 is a top plan view showing the same switch.
Figure 3:
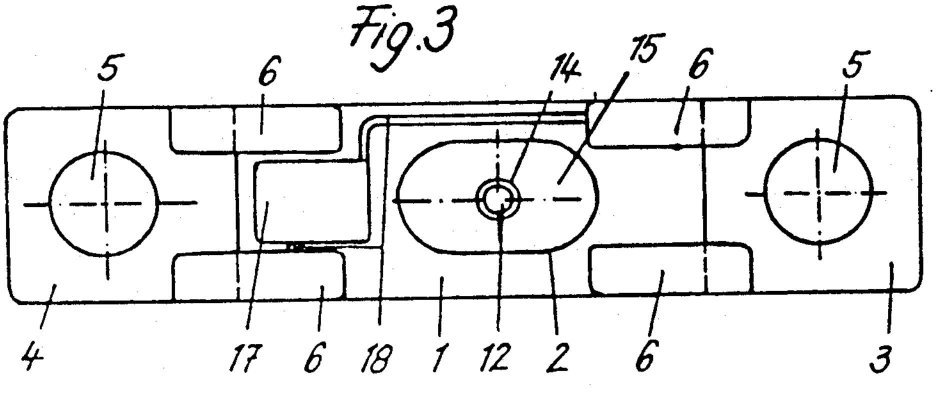
FIG. 3 shows the same switch in a view on its underside.

The switch shown in FIGS. 1 to 3 consists of a thin rectangular carrier 1 that is made of alumina ceramics and has a slot 2 at its center. The elongate carrier 1 is metallized at both ends on its bottom surface **1*a*, where two terminal tabs 3 and 4 are secured, each of which has a soldering eye 5 at one end and is forked at its other end. Those prongs 6 of the fork which contact the metallized bottom surface 1*a* of the carrier have been dip-soldered to the carrier 1. Those prongs 7 of the fork which lie on the top surface of the carrier 1 are not soldered to the carrier 1**.

A contact spring 8 has been spot-welded at one end to one terminal tab 3 and at its free end carries a contact element 9. A fixed contact 10 has been welded to the other terminal tab 4 opposite to the movable contact element 9. The contact spring 8 has approximately at its center a hole 11, in which a plastic pin 12 is captively held. The pin 12 has a head 13 that bears on the top face of the contact spring 8. The shank of the pin extends down through a central hole 14 at the center of a snap-action bimetal plate 15, which is disposed between the carrier 1 and the contact spring 8, and through the slot 2 in the carrier 1. Between the contact spring 8 and the snap-action bimetal plate 15 the pin 12 is provided with an enlarged collar, which maintains a certain distance and a thermal shielding between the contact spring 8 and the snap-action bimetal plate 15.

A film resistor 17 is disposed on the bottom surface **1*a* of the carrier 1 and is connected by conductor strips 18 to the two terminal tabs 3 and 4 so as to shunt the switch. In response to a temperature above its switching temperature, the snap-action bimetal plate 15 raises the contact spring 8 so that current is then flowing only through the film resistor 17 and the latter is heated and heats the snap-action bimetal plate 15** and prevents it from springing back to its initial position in which the switch would be closed.

The snap-action bimetal plate 15 is hardly influenced by the Joule heat that is generated in the contact spring 8. This is ensured by the shielding action of the collar 16 and because the contact between the snap-action bimetal plate 15 and the carrier 1 permits a dissipation of heat from the bimetal element to the carrier 1.

The main difference between the bimetal thermoswitch shown in FIGS. 4 and 5 and that shown in FIGS. 1 to 3 resides in that the snap-action bimetal plate 15 is not disposed at the top of the carrier 1 between the latter and the contact spring 8 but is loosely held on the underside of the carrier 1 by holder 20, which is an integral part of that terminal tab 3 to which the contact spring 8 is secured. Like the terminal tab shown in FIG. 1, that terminal tab 3 is forked. The fixed end of the contact spring 8 has been inserted under the upper prong 7 of the fork of the terminal tab 3 and the two parts have been soldered to the carrier 1. The lower prong 6 of the fork 3 is extended in length beyond the center of the carrier 1 and has been shaped to constitute a structure 20 which is similar to a pan that is formed in its bottom with a large opening 21, which extends almost from one edge to the other. At the ends of that opening, four upstanding side walls 22, 23, 24 and 25 are provided, which extend toward the bottom surface 1*a* of the carrier and are parallel to the four edges of the carrier 1. Those two walls 24 and 25 which are parallel to the ends of the carrier 1 are in contact with the bottom surface 1*a* of the carrier. The structure 20 serves as a holder for the snap-action bimetal plate 15, which is inserted before the terminal tab 3 is secured to the carrier 1. The large opening 21 ensures that the snap-action bimetal plate 15 can assume the ambient temperature without an obstruction.

To ensure that the snap-action movement performed by the snap-action bimetal plate 15 in response to a temperature rise above the switching temperature will be transmitted to the contact spring 8, the carrier 1 is formed at its center with a cylindrical through hole 26, into which a cylindrical push rod 27 has been inserted, which has a lenticular head 28. The push rod may consist of a plastic injection molding. The shank diameter of the push rod should be only slightly smaller than the diameter of the hole 26 so that the push rod 27 will be guided in the hole 26 substantially without a play.

The contact spring extends over the head 28 of the push rod 27 and ensures that the push rod 27 will be movable, but captive.

The length of the shaft of the push rod 27 is so selected that the depending push rod 27 terminates slightly above the snap-action bimetal plate when the latter is cambered downwardly and is at a temperature below its switching temperature. This is shown in solid lines in FIG. 4. But when the temperature of the snap-action bimetal plate rises above its switching temperature, the plate will invert its camber, as is indicated by dotted lines in FIG. 4, to raise the push rod 27 so that the latter will raise the contact spring 8 and the contact element 9 at the top of that spring will be lifted from the fixed contact 10.

The difference between the bimetal thermoswitch shown in FIGS. 6 and 7 and the switch shown in FIGS. 4 and 5 resides essentially in the design of the terminal tabs and of the means for holding the snap-action bimetal plate. The two terminal tabs 3 and 4 are not forked but at those ends which are intended to be secured to the carrier 1 have been angled twice on one side so as to form an approximately C-shaped structure, with which the terminal tabs 3 and 4 embrace the carrier 1 from the side and have been soldered to the latter. The fixed end of the contact spring 8 is again disposed between the carrier and the reversely bent leg 30 of the terminal tab 3, which leg lies on the carrier, and the corresponding leg 31 of the opposite terminal tab carries the fixed contact 10.

The means for holding the snap-action bimetal plate 15 are constituted only in part by the terminal tab 3, which is provided with an extension 32, which has been angled to form a step. A second through hole 33 is formed in the carrier 1 opposite to the extension 32 and contains a holder 34, which has been inserted from above. That holder 34 consists of a pin, which has a flat head 35, which lies on the top surface of the carrier 1, and a shank 36, which is formed below the carrier 1 with a shallow recess 37, which faces the extension 32 of the terminal tab 3. The snap-action bimetal plate 15 lies at one end in the gap defined between the bottom surface 1*a* of the carrier and the extension 32 and at its opposite end in the recess 37 of the pin 34. To captivate the snap-action bimetal plate 15, it is formed at one end with a recess 38, which receives the pin 34, so that the snap-action bimetal plate cannot perform a lateral pivotal movement out of the recess 37. At the opposite edge of the snap-action bimetal plate it is prevented from pivotally moving out of the range of the extension 32 because the snap-action bimetal plate has there an edge 39, which is parallel to the end of the carrier 1 and extends almost throughout the width of the carrier 1 and is closely spaced from the wall 32*a*, which has been angled to extend at right angles to the carrier 1.

The retaining pin 34 permits the snap-action bimetal plate 15 to be mounted in a simple manner. The pin may simply be inserted into the associated hole 33 and is captivated therein by the contact spring 8 extending thereover. But the pin is preferably fixed in the associated hole 33, e.g., in that the diameter of the pin closely matches the diameter of the hole.

The difference between the bimetal thermoswitch shown in FIGS. 8 and 9 and the switch shown in FIGS. 4 and 5 resides essentially in the design of the terminal tabs and the means for holding the snap-action bimetal plate. The two terminal tabs 3 and 4 are substantially identical and substantially resemble the terminal tab 4 in FIGS. 4 and 5. Neither of the two terminal tabs 3 and 4 serves to retain the snap-action bimetal plate 15. This is accomplished by two separate holders 40, which are pin-shaped like the holder 34 of FIG. 6. The two holders 40 have a flat head 45, which lies on the top surface of the carrier 1, a shank 46, which extends through an associated hole 43 in the carrier 1, a collar 44, which bears on the bottom surface 1*a* of the carrier, and a wedge-shaped opening 47, which is formed in the shank 46 below the collar 44. The holders 40 may consist of plastic injection moldings, which are initially made without the head 45 and are then inserted into the associated holes 43 from below as far as to the collar 44 and captively mounted in the carrier 1 in that the top end of the pin is formed with a head 45 by thermoplastic deformation. The two holders are so arranged that the two wedge-shaped openings 47 are in register on the same level and receive the two opposite edges 49 of the snap-action bimetal plate 15. Each of said edges is formed with a recess 48, which corresponds to the recess 38 in FIG. 7 and which receives the holders 40 to prevent a loss of the snap-action bimetal plate 15.

In a modification of the switch shown in FIG. 4 the switch shown in FIG. 8 comprises a push rod 27, which is disposed between the snap-action bimetal plate 15 and the contact spring 8 and is provided above its head 28 with a cylindrical extension 41, which extends with a small play through a hole in the contact spring 8 and thus ensures an improved centering.

The bimetal thermoswitch shown in FIGS. 10 and 11 has a terminal tab 4, which has substantially the same appearance as the terminal tab 4 in FIGS. 1 to 3, and has also a terminal tab 3, which has substantially the same appearance as that shown in FIGS. 1 to 3 but like the terminal tab 3 shown in FIG. 6 has in addition an extension 32 for retaining the snap-action bimetal plate 15. Like the switch shown in FIG. 6 the switch shown in FIG. 10 has also a retaining pin 54, which has a slitted shank 56 that is undercut adjacent to one end and is resiliently locked in a through hole 33 in the carrier 1. The holder 54 has been inserted into the hole 33 from below as far as to a collar 55, which is adjoined by a flat head 57. As in the illustrative embodiment of FIGS. 6 and 7, the snap-action bimetal plate 15 has in the range of action of the holder 54 a recess 38, which receives the collar 55 of the holder 54.

Instead of the holder 54 shown in FIG. 10, the holder 34 shown in FIG. 6 and the holder 40 shown in FIG. 8 it is possible to use holders such as are shown in FIGS. 12 and 13 and differ from the holder shown in FIG. 6 in that the recess 37 contains a semicircular projection, which faces the snap-action bimetal plate 15 and extends into the recess 38 thereof.

Another important difference between the switch shown in FIGS. 10 and 11 and the illustrative embodiments described hereinbefore resides in that the movement of the snap-action bimetal plate 15 is transmitted to the contact spring 8 by a small ball rather than by a push rod. The ball 58 is disposed in the cylindrical hole 26, which is formed in the carrier and is slightly larger than the ball in diameter. The diameter of the ball 58 is so selected and is matched to the position of the contact spring 8 and of the snap-action bimetal plate 15 that in the closed and open switch the ball will be captively held in the cage which is constituted by the snap-action bimetal plate, the hole 26 in the carrier and the contact spring 8. The diameter of the ball 58 is preferably approximately twice the thickness of the carrier 1. The ball suitably consists of glass or a ceramic material. Such balls can be made with a high precision and can easily be inserted and will tend to decrease the spread of the switching temperatures of the switches of a series.

The difference between the bimetal thermoswitch shown in FIGS. 14 and 15 and the switch shown in FIGS. 1 and 3 essentially resides in that its snap-action bimetal plate 15 is heated by a fixed resistor 60, the location of which is indicated in FIG. 14 by a circle. As is indicated in FIG. 15 the fixed resistor might consist of a wire resistor. The fixed resistor is connected as a series resistor to the switch so that the electric current flows from the terminal tab 3 first over the extension 61 of that tab, which extension lies against the bottom surface 1*a* of the carrier, to one end of the fixed resistor 60 and through the latter to a conductor strip 62, which extends back on the bottom surface 1*a* of the carrier 1*a* to that end thereof to which the terminal tab 3 is secured. At that end the conductor strip is backfolded to extend on the top surface of the carrier 1 and then extends as a framelike structure 63 along one edge of the carrier 1 first toward the opposite terminal tab 4, then to the opposite longitudinal edge of the carrier 1 and back along said opposite edge toward the terminal tab 3. At that end the framelike structure 63 is soldered to the carrier 1 and fixes also the contact spring 8, which has a fixed end that has been fitted there between the framelike structure 63 and the carrier 1. The framelike structure 63 suitably consists of a sheet metal element which is made in one operation from the sheet metal from which the terminal tab 3 is made too. The latter has also a lug 64, which lies on the top surface of the carrier 1 but has no direct connection to the contact spring 8. The lug 64 and the extension 61 constitute a fork, which has been fitted onto the carrier 1.

The interior 65 of the framelike structure 63 serves to accommodate the snap-action bimetal plate 15. Under said plate, the carrier 1 has a through opening 66, through which heat which has been generated by the fixed resistor 60 can be transferred to the snap-action bimetal plate 15. As soon as said plate has been heated to its switching temperature by the fixed resistor, the plate is snap-inverted and acts on a downwardly facing bulge 67 of the contact spring 8 to raise the latter so that the switch is opened and the flow of current through the fixed resistor 60 is interrupted at the same time. Such a switch may be used as a timer, which will open after a time which depends on the heat output. Alternatively the fixed resistor 60 might consist of a fusible wire for a protection against an overcurrent. In the bimetal thermoswitch shown in FIGS. 16 and 17, two identical alumina ceramic slabs 1 and 1' are combined in a sandwich unit. The terminal tab 4 resembles the one shown in FIGS. 4 and 5 but has a further extension 71, which has been inserted into the space between the two slabs 1 and 1'. The other terminal tab 3 does not embrace the slabs 1, 1' and has merely been inserted with an extension 70 into the space between the two slabs 1, 1'. The two extensions 70, 71 keep the slabs 1, 1' in a spaced apart, parallel relationship. The arrangement of the contact spring 8, the snap-action bimetal plate 15 and the push rod 27 connecting them is similar to that shown in FIG. 4.

Two electric resistor layers 72 and 73 are provided on the top surface of the lower slab 1' and extend parallel to each other along the slab 1' and are in contact with two electric conductor strips 74 and 75, which extend on the same slab 1'. One conductor strip 74 is connected to the extension 70 of the terminal tab 3. The other conductor strip leads to an electric terminal 76. To reveal the arrangement of the resistor layers 72 and 73 and of the conductor strips 74 and 75, the upper slab 1 provided with the contact spring has partly been broken away in FIG. 17.

A U-shaped slider 77 is provided, which is slidably guided on the longitudinal edges of the lower slab 1' and is reversely bent about the underside of the lower slab 1' and has two free end portions 78 and 79, which extend into the space between the two slabs 1 and 1'. The two free ends 78 and 79 constitute corrugated contact springs, which are in contact with the resistor layers 72 and 73, respectively, and both of which bear on the opposite underside of the upper slab 1.

The current flows from the terminal tab 3 over its extension 70 to the conductor strip 74, further to the resistor layer 72 and through the slider 77 to the resistor layer 73 and further in the conductor strip 75 to the electric terminal 76, which is a portion of a U-shaped member 80, which embraces the two slabs 1 and 1'. On the top surface of the upper slab 1 the terminal 76 has been soldered to the slab 1 with the end of the contact spring 8 interposed, and is continued on the bottom surface of the lower slab 1' by a pan-shaped holder 20 for the snap-action bimetal plate 15 (as in FIG. 4). That U-shaped member 80 has no direct connection to the terminal tab 3 and the extension 70 of the tab 3 extends through a window 81 of the U-shaped member 80.

As in the example shown in FIGS. 14 and 15, the resistor layers 72 and 73 constitute a series resistor for the switch but the resistor is variable in this case by the slider 77.

It will obviously be possible to provide such a variable resistor as a parallel resistor.

The bimetal switch shown in FIG. 18 comprises two identical alumina ceramic slabs 1 and 1', which lie directly one on the other. Under the contact spring 8 the upper slab 1 has a hole 82, which is constricted at its top rim by a collar 83. A snap-action bimetal plate 15 lies in the opening that is constituted by that hole 82 and is held against falling out by the collar 83 and upon a temperature rise above its switching temperature is snap-inverted to lift the contact spring 8. The opening constitutes means for retaining the snap-action bimetal plate and because the latter is sunk the contact spring 8 has a bulge 67, which faces the snap-action bimetal plate.

A difference between the bimetal thermoswitch shown in FIG. 19 and the one shown in FIG. 18 resides in that the hole 82 in the upper slab 1 is continued by an opening 85 in the lower alumina ceramic slab 1'. That opening consists of a blind hole, which is somewhat larger in diameter. The snap-action bimetal plate 15 now lies in the blind hole 85. An ordinary snap-action plate 86 lies over the plate 15 and as it does not consist of a bimetal is snap-inverted under mechanical action rather than in response to a temperature change. The two snap-action plates 15 and 86 are held in the blind hole 85 because the overlying hole 82 in the upper slab 1 is somewhat narrower than the underlying blind hole 85. When the snap-action bimetal plate 15 is heated above its switching temperature, it will snap to its inverted shape and will thus enforce also a snap-inversion of the ordinary snap-action plate 86 so that the latter raises the contact spring 8. In response to a temperature drop below the switching temperature of the snap-action bimetal plate 15 such a switch will not automatically close because the ordinary snap-action plate 86 will remain in its shape until it is restored from the outside, e.g., by hand.

I claim:

1. A bimetal thermoswitch comprising:

an electrically insulating flat carrier formed of a thin alumina ceramic slab;

at least two electrical terminals connected to said carrier in an electrically isolated configuration;

a fixed electrical contact connected to a first of said electrical terminals;

a contact spring having one end connected to a second of said electrical terminals, said contact spring having an electrical contact element disposed on an opposite end;

bimetal element means for moving said contact spring in a direction transverse to the plane of said carrier in response to changes in temperature;

a shunt resistor connected at one end to said fixed contact and at another end to said second of said electrical terminals; and a series resistor connected at one end to said contact spring and at another end to said second of said electrical terminals.

2. A bimetal thermoswitch comprising:

an electrically insulating flat carrier formed of a thin alumina ceramic slab;

at least two electrical terminals connected to said carrier in an electrically isolated configuration;

a fixed electrical contact connected to a first of said electrical terminals;

a contact spring having one end connected to a second of said electrical terminals, said contact spring having an electrical contact element disposed on an opposite end;

bimetal element means for moving said contact spring in a direction transverse to the plane of said carrier in response to changes in temperature; and a series resistor connected at one end to said contact spring and at another end to said second of said electrical terminals.

3. A bimetal thermoswitch according to claim 2, characterized in that the carrier is metallized in part.

4. A bimetal thermoswitch according to claim 2, characterized in that the fixed contact and the contact spring provided with the movable contact element are disposed on one side of the carrier and the bimetal element is provided on that side of the carrier which faces away from the fixed contact and the contact spring, and the carrier has a hole, which is disposed between the contact spring and the bimetal element and which contains an actuating element, which transmits a movement of the bimetal element to the contact spring.

5. A bimetal thermoswitch according to claim 4, characterized in that the actuating element is a push rod, which is axially movably guided in the cylindrical hole in the carrier.

6. A bimetal thermoswitch according to claim 5, characterized in that the push rod has an enlarged portion, namely, a head or collar, which is disposed between the carrier and the contact spring and is larger in diameter than the hole in the carrier.

7. A bimetal thermoswitch according to claim 6, characterized in that the contact spring has a hole which is aligned with the hole in the carrier, and the push rod has an extension that extends through the hole in the contact spring.

8. A bimetal thermoswitch according to claim 4, characterized in that the actuating element is a ball, which is loosely held in a cage which is constituted by the contact spring, the bimetal element and the hole in the carrier.

9. A bimetal thermoswitch according to claim 8, characterized in that the ball is made of glass.

10. A bimetal thermoswitch according to claim 4, characterized in that the bimetal element is a plate, which is loosely, but captively, held on the carrier by holders, which are secured to the carrier and embrace the edge of the bimetal element and/or constitute a stop for the edge of the bimetal element.

11. A bimetal thermoswitch according to claim 10, characterized in that at least one of said holders is an integral part of the electrical terminals.

12. A bimetal thermoswitch according to claim 10, characterized in that one of said holders comprises a pin, by which said at least one holder has been captively inserted into a hole in the carrier and in particular is resiliently locked therein.

13. A bimetal thermoswitch according to claim 10, characterized in that the bimetal element is provided at its edge with one or more recesses which receive respective ones of the holders.

14. A bimetal thermoswitch according to claim 2, characterized in that another alumina ceramic slab is provided under the carrier and is joined to the carrier in a sandwich unit.

15. A bimetal thermoswitch according to claim 14, characterized in that the unit which is constituted by the carrier and the alumina ceramic slab, which contact each other, has an aperture which is open at least toward the contact spring and in which the bimetal element is loosely but captively held.

16. A bimetal thermoswitch according to claim 15, characterized in that the aperture is a through hole that is formed in the carrier and at its top is constricted and at its bottom is covered by the slab.

17. A bimetal thermoswitch according to claim 15, characterized in that a portion of the opening formed in said unit is constituted in the slab by an open-topped blind hole or by a through hole which is constricted on the underside.

18. A bimetal thermoswitch according to claim 17, characterized in that the hole in the slab has a larger inside width than the hole in the carrier.

19. A bimetal thermoswitch according to claim 15, characterized in that the contact spring carries a bulge or a pin, which is disposed over the hole in the alumina ceramic carrier and is directed toward and forms a stop for the bimetal element.

20. A bimetal thermoswitch according to claim 2, in which the carrier is provided with one or more sensors.

21. A bimetal thermoswitch according to claim 4, in which a plastic member which insulates the bimetal element and the contact spring from each other has been inserted into a hole in the contact spring.

22. A bimetal thermoswitch according to claim 21, in which said plastic member has a large surface thermally shielding the bimetal plate from the contact spring.

23. A bimetal thermoswitch according to claim 8, in which the ball is made of a ceramic material.

24. A bimetal thermoswitch according to claim 2, characterized in that the fixed contact and the contact spring provided with the movable contact element are disposed on one side of the carrier and the bimetal element is provided on that side of the carrier which faces away from the fixed contact and the contact spring;

the carrier has a hole, which is disposed between the contact spring and the bimetal element and which contains an actuating element which transmits a movement of the bimetal element to the contact spring;

the bimetal element is loosely, but captively, held in the carrier by holders which are secured to the carrier and constitute a stop for the edge of the bimetal element; and at least one of said holders comprises a pin, by which said at least one holder has been captively inserted into a hole in the carrier and in particular is resiliently locked therein.

25. A bimetal thermoswitch according to claim 2, characterized in that the fixed contact and the contact spring provided with the movable contact element are disposed on one side of the carrier and the bimetal element is provided on that side of the carrier which faces away from the fixed contact and the contact spring;

the carrier has a hole, which is disposed between the contact spring and the bimetal element and which contains an actuating element, which transmits a movement of the bimetal element to the contact spring;

the bimetal element is loosely, but captively, held on the carrier by holders which are secured to the carrier and constitute a stop for the edge of the bimetal element; and the bimetal element is provided at its edge with one or more recesses, which receive respective ones of the holders.

26. A bimetal thermoswitch comprising:

an electrically insulating flat carrier formed of a thin alumina ceramic slab;

at least two electrical terminals connected to said carrier in an electrically isolated configuration;

a fixed electrical contact connected to a first of said electrical terminals;

a contact spring having one end connected to a second of said electrical terminals, said contact spring having an electrical contact element disposed on an opposite end;

bimetal element means for moving said contact spring in a direction transverse to the plane of said carrier in response to changes in temperature; and a shunt resistor connected to one end of said fixed contact and at another end to said second of said electrical terminals.

27. A bimetal thermoswitch according to claim 26, characterized in that the carrier is metallized in part.

28. A bimetal thermoswitch according to claim 26, characterized in that the fixed contact and the contact spring provided with the movable contact element are disposed on one side of the carrier and the bimetal element is provided on that side of the carrier which faces away from the fixed contact and the contact spring, and the carrier has a hole, which is disposed between the contact spring and the bimetal element and which contains an actuating element, which transmits a movement of the bimetal element to the contact spring.

29. A bimetal thermoswitch according to claim 28, characterized in that the actuating element is a push rod, which is axially movably guided in the cylindrical hole in the carrier.

30. A bimetal thermoswitch according to claim 29, characterized in that the push rod has an enlarged portion, namely, a head or collar, which is disposed between the carrier and the contact spring and is larger in diameter than the hole in the carrier.

31. A bimetal thermoswitch according to claim 30, characterized in that the contact spring has a hole, which is aligned with a hole in the carrier, and the push rod has an extension that extends through the hole in the contact spring.

32. A bimetal thermoswitch according to claim 28, characterized in that the actuating element is a ball, which is loosely held in a cage which is constituted by the contact spring, the bimetal element and the hole in the carrier.

33. A bimetal thermoswitch according to claim 32, characterized in that the ball is made of glass.

34. A bimetal thermoswitch according to claim 28, characterized in that the bimetal element is a plate, which is loosely, but captively, held on the carrier by holders, which are secured to the carrier and embrace the edge of the bimetal element and/or constitute a stop for the edge of the bimetal element.

35. A bimetal thermoswitch according to claim 34, characterized in that at least one of said holders is an integral part of one of the electric terminals.

36. A bimetal thermoswitch according to claim 34, characterized in that one of said holders comprises a pin, by which said at least one holder has been captively inserted into a hole in the carrier and in particular is resiliently locked therein.

37. A bimetal thermoswitch according to claim 34, characterized in that the bimetal element is provided at its edge with one or more recesses, which receive respective ones of the holders.

38. A bimetal thermoswitch according to claim 26, characterized in that another alumina ceramic slab is provided under the carrier and is joined to the carrier in a sandwich unit.

39. A bimetal thermoswitch according to claim 38, characterized in that the unit which is constituted by the carrier and the alumina ceramic slab, which contact each other, has an aperture which is open at least toward the contact spring and in which the bimetal element is loosely but captively held.

40. A bimetal thermoswitch according to claim 39, characterized in that the aperture is a through hole that is formed in the carrier and at its top is constricted and at its bottom is covered by the slab.

41. A bimetal thermoswitch according to claim 39, characterized in that a portion of the opening formed in said unit is constituted in the slab by an open-topped blind hole or by a through hole which is constricted on the underside.

42. A bimetal thermoswitch according to claim 41, characterized in that the hole in the slab has a larger inside width than the hole in the carrier.

43. A bimetal thermoswitch according to claim 39, characterized in that the contact spring carries a bulge or a pin, which is disposed over the hole in the alumina ceramic carrier and is directed toward and forms a stop for the bimetal element.

44. A bimetal thermoswitch according to claim 26, in which the carrier is provided with one or more sensors.

45. A bimetal thermoswitch according to claim 28, in which a plastic member which insulates the bimetal element and the contact spring from each other has been inserted into a hole in the contact spring.

46. A bimetal thermoswitch according to claim 45, in which the said plastic member has a large surface thermally shielding the bimetal element from the contact spring.

47. A bimetal thermoswitch according to claim 32, in which the ball is made of a ceramic material.

48. A bimetal thermoswitch according to claim 26, characterized in that the fixed contact and the contact spring provided with the movable contact element are disposed on one side of the carrier and the bimetal element is provided on that side of the carrier which faces away from the fixed contact and the contact spring, the carrier has a hole, which is disposed between the contact spring and the bimetal element and which contains an actuating element, which transmits a movement of the bimetal element to the contact spring, the bimetal element is loosely, but captively, held in the carrier by holders which are secured to the carrier and constitute a stop for the edge of the bimetal element, and at least one of said holders comprises a pin, by which said at least one holder has been captively inserted into a hole in the carrier and in particular is resiliently locked therein.

49. A bimetal thermoswitch according to claim 26, characterized in that the fixed contact and the contact spring provided with the movable contact element are disposed on one side of the carrier and the bimetal element is provided on that side of the carrier which faces away from the fixed contact and the contact spring, the carrier has a hole, which is disposed between the contact spring and the bimetal element and which contains an actuating element, which transmits a movement of the bimetal element to the contact spring, the bimetal element is loosely, but captively, held on the carrier by holders which are secured to the carrier and constitute a stop for the edge of the bimetal element, and the bimetal element is provided at its edge with one or more recesses, which receive respective ones of the holders.

* * * * *